(12) United States Patent
Klaus et al.

(10) Patent No.: US 7,103,523 B2
(45) Date of Patent: Sep. 5, 2006

(54) METHOD AND APPARATUS FOR IMPLEMENTING MULTIPLE CONFIGURATIONS OF MULTIPLE IO SUBSYSTEMS IN A SINGLE SIMULATION MODEL

(75) Inventors: John Hubert Klaus, Rochester, MN (US); Paul Matthew Krolak, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 753 days.

(21) Appl. No.: 09/797,379

(22) Filed: Mar. 1, 2001

(65) Prior Publication Data

US 2002/0123871 A1   Sep. 5, 2002

(51) Int. Cl.
*G06F 17/50* (2006.01)
(52) U.S. Cl. ............... 703/14; 716/1; 716/18
(58) Field of Classification Search ......... 703/14; 712/33; 326/35, 100; 312/33; 716/1, 18
See application file for complete search history.

(56) References Cited

U.S. PATENT DOCUMENTS

| | | | | |
|---|---|---|---|---|
| 5,452,239 A | * | 9/1995 | Dai et al. | 703/19 |
| 5,848,236 A | * | 12/1998 | Dearth et al. | 714/33 |
| 5,996,034 A | * | 11/1999 | Carter | 710/100 |
| 6,023,754 A | * | 2/2000 | DuLac et al. | 712/33 |
| 6,118,297 A | * | 9/2000 | Schenck | 326/35 |
| 6,145,117 A | * | 11/2000 | Eng | 716/18 |
| 6,571,204 B1 | * | 5/2003 | Meyer | 703/22 |

OTHER PUBLICATIONS

Handbook of Simulation, by Jerry Banks, John Wiley & Sons, Inc., Aug. 1998, ISBN 0-471-13403-1, pp. 31-33.*
"An automatic finite state machine synthesis using temporal logic decomposition", Bekki, K.; Nagai, T.; Hamada, N.; Shimizu, T.; Hiratsuka, N.; Shima, K.; Computer-Aided Design, 1991. ICCAD-91. Digest of Technical Papers., 1991 IEEE International Conferenc.*
Latch-to-latch timing rules, Champemowne, A.F.; Bushard, L.B.; Rusterholz, J.T.; Schomburg, J.R.; Computers, IEEE Transactions on, vol. 39, Issue: 6, Jun. 1990 pp. 798-808.*
An Engineering Approach to Digital Design, by William I. Fletcher, Prentice Hall, 1990. pp. 212-213, 312, and 411.*
R. Ranjan, V. Singhal, F. Somenzi, R. Brayton "Using combinational Verification for Sequential Circuits" International Workshop on Logic Synthesis 1997, pp. 1-9.*
R. Ranjan, V. Singhal, F. Somenzi, R. Brayton "Using combinational Verification for Sequential Circuits" IEEE, 1999, pp. 138-144.*
Stan Y. Liao, "Towards a New Standard for System-Level Design" ACM 2000 1-58113-268-9/00/05, pp. 2-6.*

* cited by examiner

*Primary Examiner*—Paul L. Rodriguez
*Assistant Examiner*—Dwin M. Craig
(74) *Attorney, Agent, or Firm*—Joan Pennington

(57) ABSTRACT

A method and apparatus are provided for implementing multiple configurations of multiple input/output (IO) subsystems in a single simulation model. At least one bus routing switch is included in the single simulation model. Each bus routing switch includes a plurality of ports respectively connected to a plurality of IO busses. Predefined ones of the plurality of IO busses are connected to respective multiple input/output (IO) subsystems in the single simulation model. The bus routing switch is selectively configurable for interconnecting predetermined ones of the plurality of ports. The bus routing switch includes a variable delay latch structure to simulate the effect of long wires. Each bus routing switch includes a plurality of multiplexers. Each of the plurality of multiplexers includes inputs connected to the plurality of ports, an output connected to a respective one of the plurality of ports and has a control input for configuring the bus routing switch.

11 Claims, 10 Drawing Sheets

POINT TO POINT

DATA STRIPING

CLUSTERING LOOP

CHAIN OR STRING

LOOP

CLUSTERING LOOP
WITH INCLUDED IO

PRIOR ART

METHOD AND APPARATUS FOR IMPLEMENTING MULTIPLE CONFIGURATIONS OF MULTIPLE IO SUBSYSTEMS IN A SINGLE SIMULATION MODEL

FIELD OF THE INVENTION

The present invention relates generally to the data processing field, and more particularly, relates to a method and apparatus for implementing multiple configurations of multiple input/output (IO) subsystems in a single simulation model for logic simulation or logic verification.

DESCRIPTION OF THE RELATED ART

Simulation models are used for register transfer level (RTL) logic and system verification in event or cycle based simulation. Typically system models include processors, memory controllers, system bus arbiters, input/output (IO) hub chips that connect the system bus to remote input output (RIO) busses, and the IO subsystems including bridge chips and bus behaviorals. Bridge chips translate one bus protocol to another bus protocol, such as, RIO to peripheral component interconnect (PCI).

There can be a wide array of configurations required for the IO configuration, particularly as additional system functions are added that impact the ways IO bridge chips are connected to the RIO bus or other bus.

The RIO bus is a high speed, 8-bit wide, bi-directional differential bus with 40 bits total. The RIO bus supports several connection types, such as, point-to-point, loops, and rings, and several operational modes, such as, point-to-point, agent mode, clustering mode, data striping, and multihub. To adequate simulate system functions and connectivity requirements, there exists a need to connect multiple types of IO subsystems in a variety of configurations.

FIGS. 1B–1G illustrate conventional configurations of multiple IO subsystems and IO hub chips. In FIG. 1B, a point-to-point configuration of a hub and IO subsystem is shown. FIG. 1C illustrates a data striping configuration of a hub and IO subsystem. FIG. 1D illustrates a clustering loop configuration of a pair of hubs. FIG. 1E illustrates a chain or string configuration of a hub and three IO subsystems. FIG. 1F illustrates a loop configuration of a hub and three IO subsystems. FIG. 1G illustrates a clustering loop with included IO configuration of a pair of hubs and three IO subsystems.

Currently a unique system model is built for each configuration or simulation of certain configurations is foregone. This results in maintenance of multiple frameworks, multiple model builds, more server space used for model storage, and extra simulation environment maintenance.

A need exists for a way to reduce the number of models while providing simulation coverage to various IO configurations. It is desirable to provide a method and apparatus for implementing multiple configurations of multiple input/output (IO) subsystems in a single simulation model.

SUMMARY OF THE INVENTION

A principal object of the present invention is to provide a method and apparatus for implementing multiple configurations of multiple input/output (IO) subsystems in a single simulation model. Other important objects of the present invention are to provide such a method and apparatus for implementing multiple configurations of multiple input/output (IO) subsystems in a single simulation model substantially without negative effect and that overcome many of the disadvantages of prior art arrangements.

In brief, a method and apparatus are provided for implementing multiple configurations of multiple input/output (IO) subsystems in a single simulation model. At least one bus routing switch is included in the single simulation model. Each bus routing switch includes a plurality of ports respectively connected to a plurality of IO busses. Predefined ones of the plurality of IO busses are connected to respective multiple input/output (IO) subsystems in the single simulation model. The bus routing switch is selectively configurable for interconnecting predetermined ones of the plurality of ports.

In accordance with features of the invention, the bus routing switch includes a variable delay latch structure to simulate the effect of long wires. Each bus routing switch includes a plurality of multiplexers. Each of the plurality of multiplexers includes inputs connected to the plurality of ports, an output connected to a respective one of the plurality of ports and has a control input for configuring the bus routing switch.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1A:
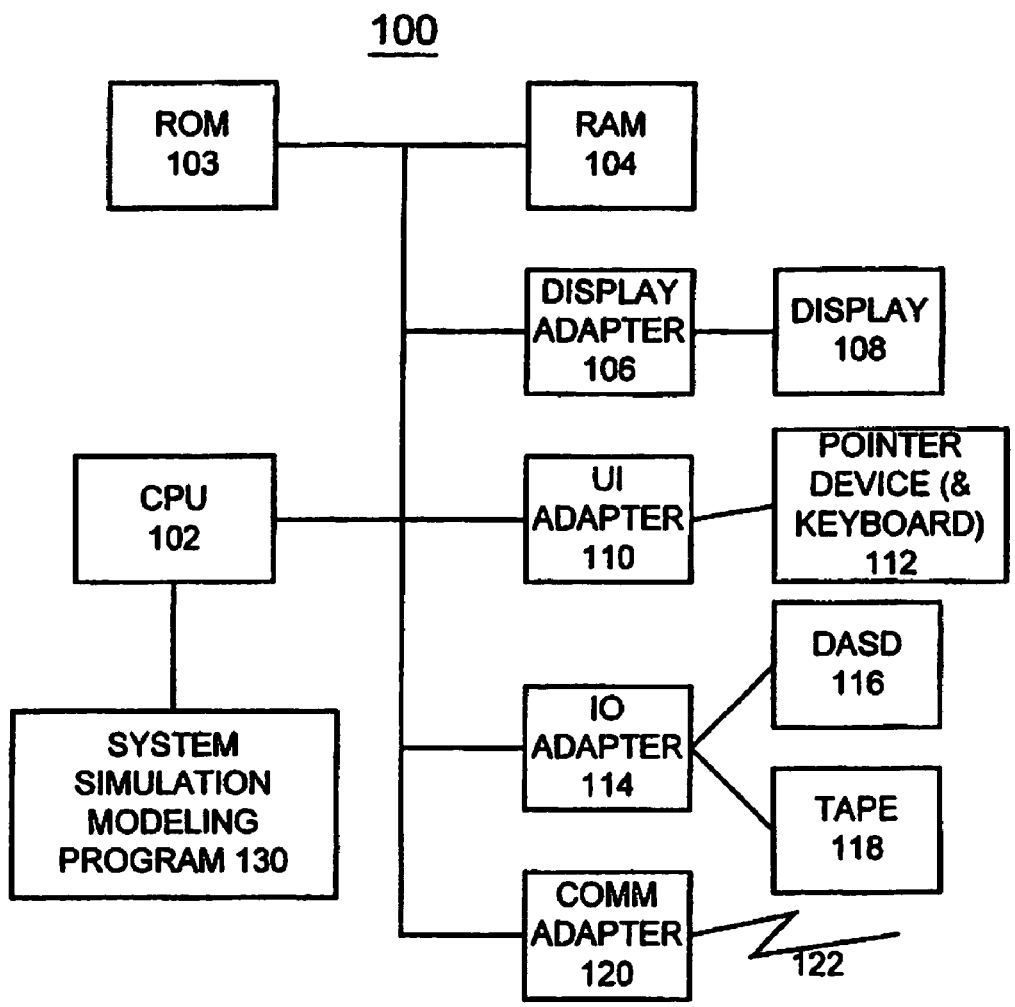
FIG. 1A is a block diagram representation illustrating a computer system for implementing a method for implementing multiple configurations of multiple input/output (IO) subsystems in a single simulation model in accordance with the preferred embodiment.
Figure 1B:
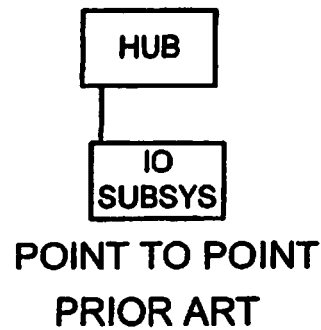
FIGS. 1B, 1C, 1D, 1E, 1F and 1G illustrate conventional configuration of multiple IO subsystems and IO hub chips.
Figure 1C:
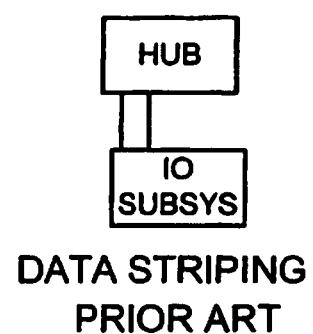
Figure 1D:
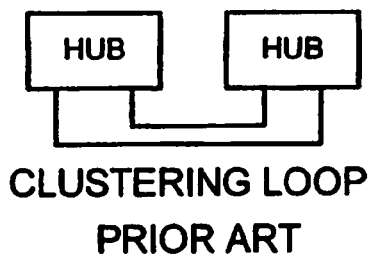
Figure 1E:
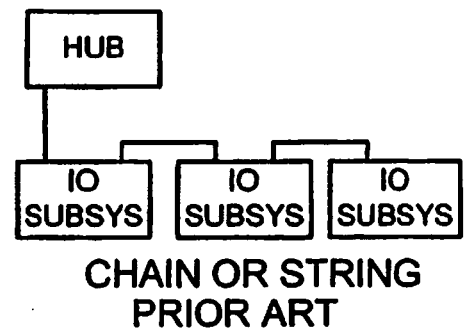
Figure 1F:
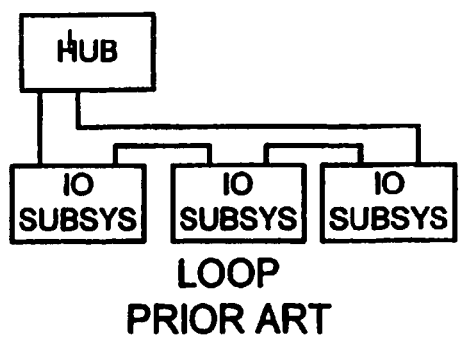
Figure 1G:
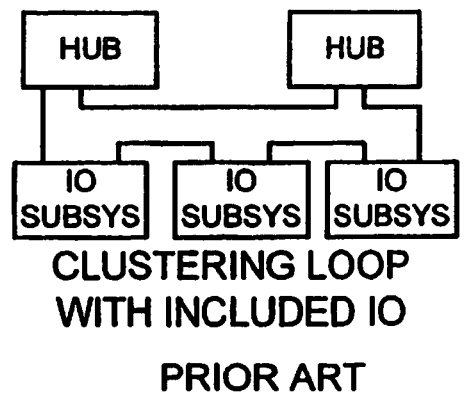

Having reference now to the drawings, in FIG. 1A, there is shown a server computer or data processing system of the preferred embodiment generally designated by the reference character 100. As shown in FIG. 1A, server computer system 100 includes a central processor unit (CPU) 102, a read only memory 103, a random access memory 104, a display adapter 106 coupled to a display 108. CPU 102 is connected to a user interface (UI) adapter 110 connected to a pointer device and keyboard 112. CPU 102 is connected to an input/output (IO) adapter 114, for example, connected to a direct access storage device (DASD) 116 and a tape unit 118. CPU 102 is connected to a communications adapter 120 providing a communications network connection function with a network 122. Server computer system 100 includes a system simulation modeling program 130 of the preferred embodiment.

Central processor unit 102 is suitably programmed for generating simulation models of the preferred embodiment, such as illustrated and described with respect to FIGS. 2–7. Various commercially available processors could be used for server computer system 100, for example, an IBM personal computer or similar workstation can be used. An example of a specific computer system on which the invention may be implemented is the International Business Machines Corp. RS/6000 computer system.

Figure 2:
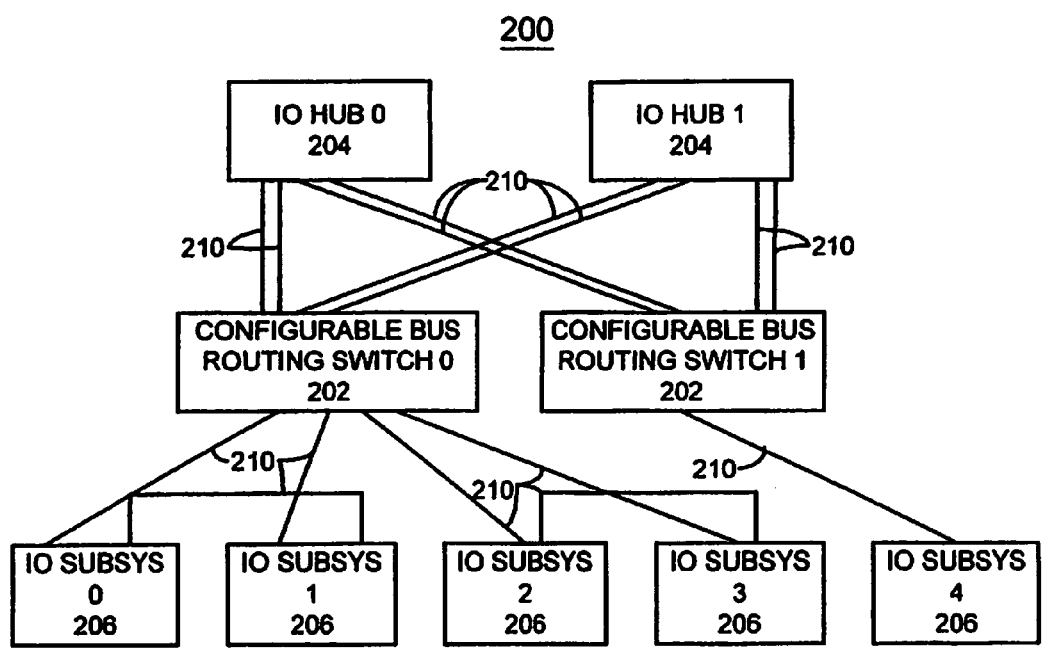
FIG. 2 is a block diagram representation illustrating a logical view of a simulation model with a first configuration of multiple IO subsystems and IO hub chips in accordance with the preferred embodiment.
Figure 3:
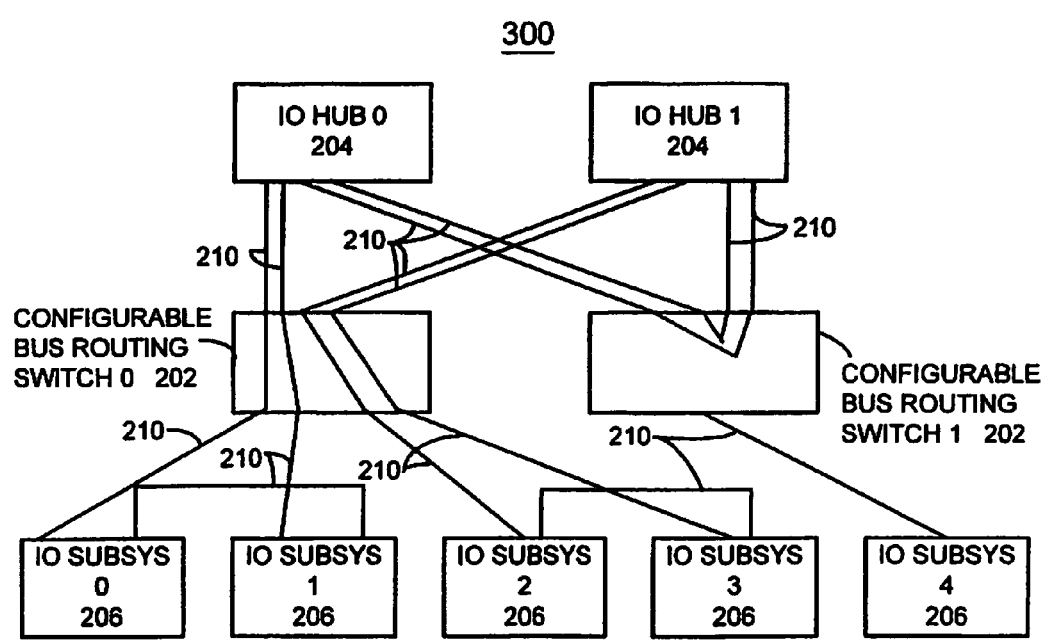
FIG. 3 is a block diagram representation illustrating a logical view of the simulation model of FIG. 1 with a second configuration of multiple IO subsystems and IO hub chips in accordance with the preferred embodiment.
Figure 4:
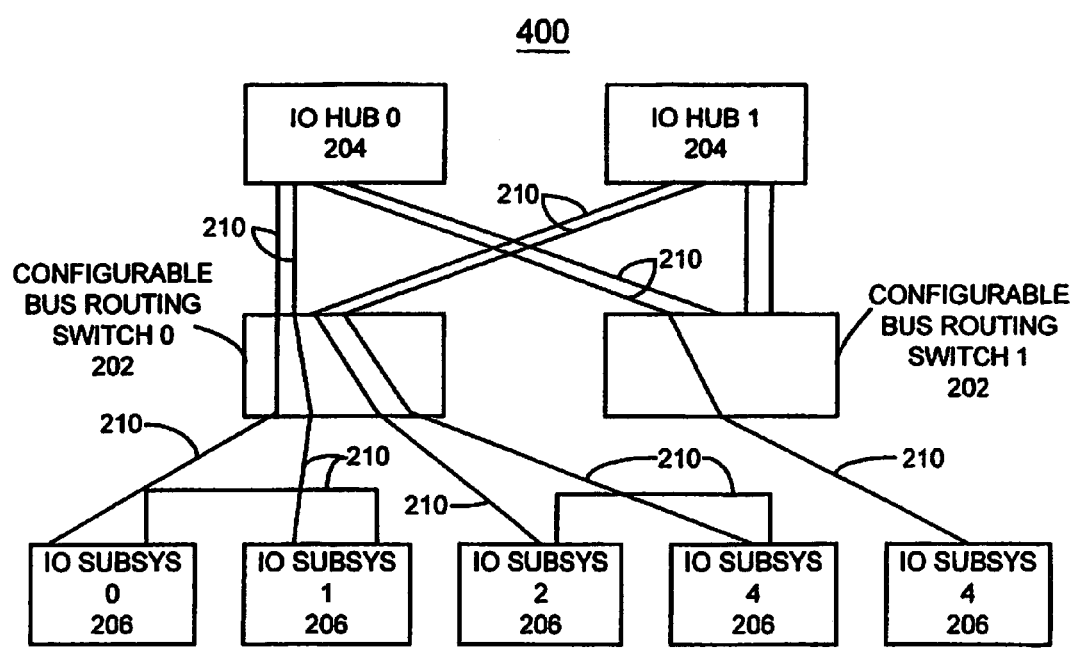
FIG. 4 is a block diagram representation illustrating a logical view of a first simulation model of FIG. 1 with a third configuration of multiple IO subsystems and IO hub chips in accordance with the preferred embodiment.
Figure 5A:
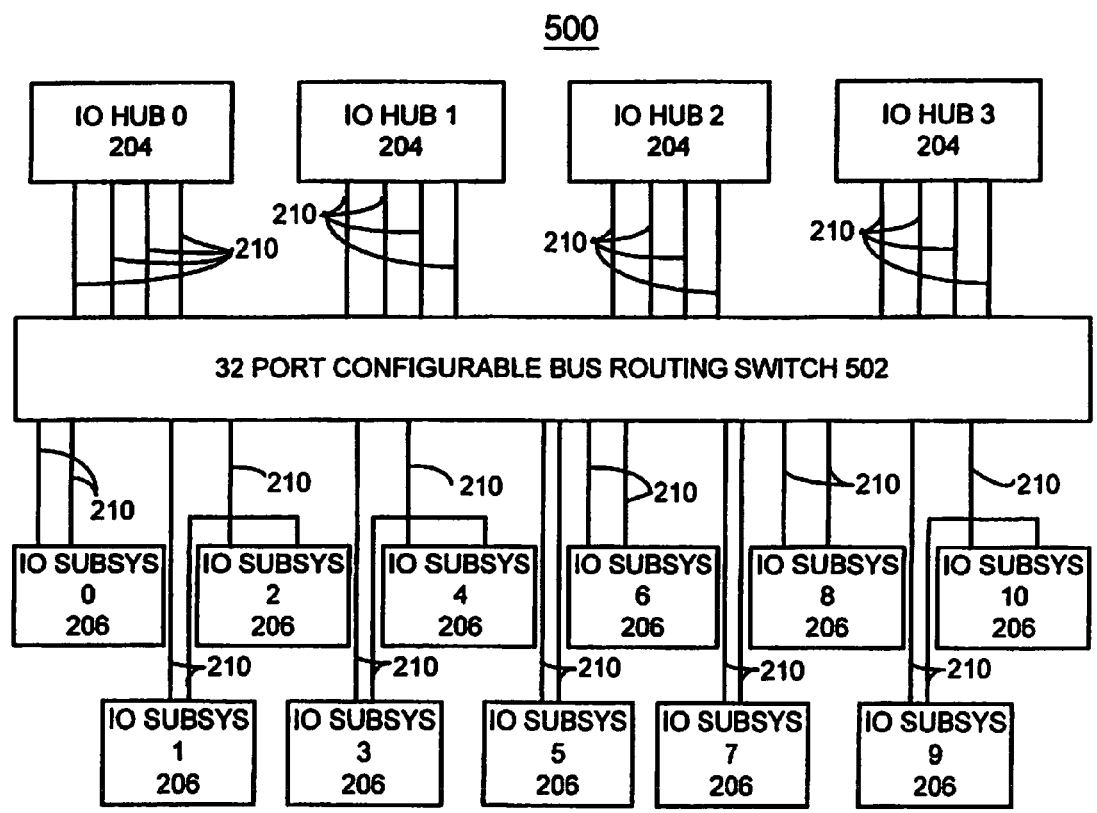
FIGS. 5A and 5B are block diagram representations illustrating a logical view of another simulation model with selected configurations for connecting multiple IO subsystems and IO hub chips in accordance with the preferred embodiment.
Figure 5B:
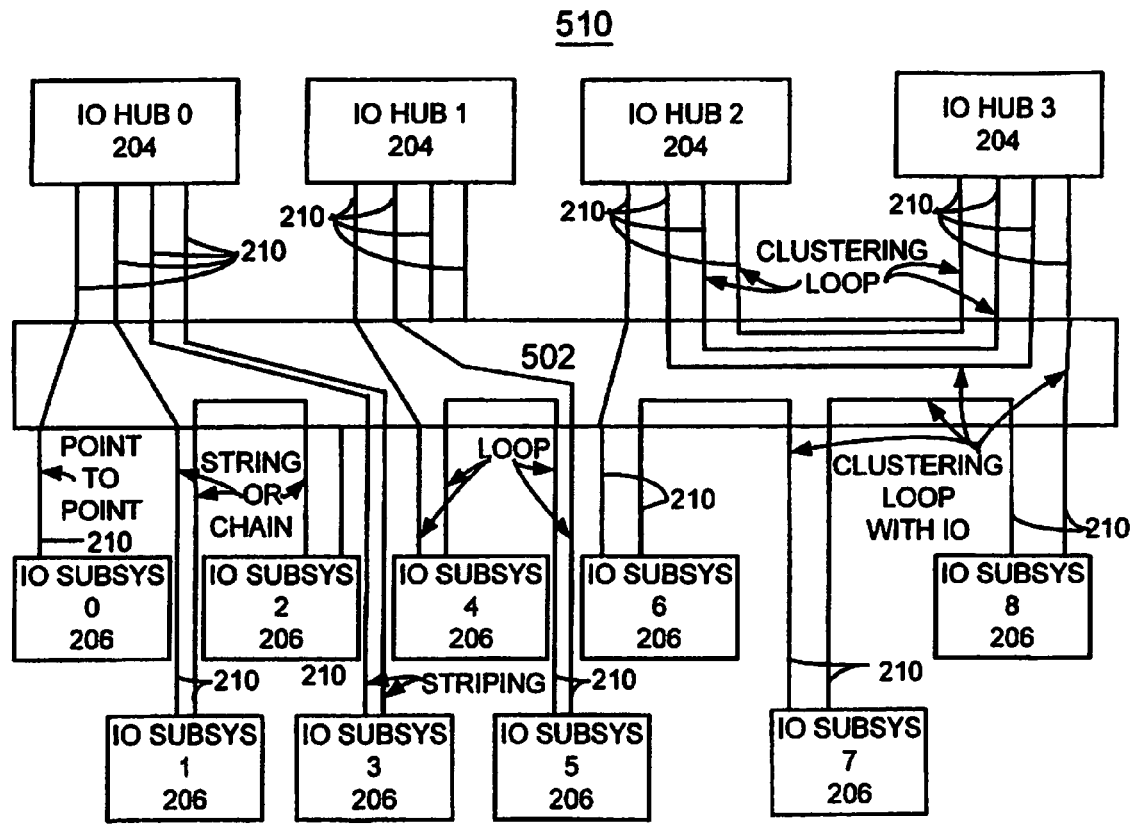

In accordance with features of the preferred embodiment, a simulation-only, configurable multi-port bus routing switch, such as, a configurable bus routing switch 202 of FIGS. 2–4 and a configurable bus routing switch 502 of FIGS. 5A and 5B, is applied by the system simulation modeling program 130 for connecting bridge and hub chips together. By applying configuration information to the simulation environment, a single simulation model can be configured in multiple ways, such as illustrated and described with respect to FIGS. 2–4, 5A and 5B, to test function that conventionally required building and maintaining multiple simulation models. By providing a configurable bus routing switch for the RIO busses, a single configuration model is provided, while providing simulation coverage to various IO configurations. While the multi-port configurable bus routing switch is described for use with RIO busses, it should be understood that the present invention is not limited to the RIO bus use.

FIG. 2 illustrates a logical view of a system simulation model with a first configuration in accordance with the preferred embodiment generally designated by the reference character 200. Simulation model 200 is illustrated in greatly simplified form sufficient for an understanding of the present invention because the utility of the present invention is not limited to details of a particular system arrangement.

Simulation model 200 includes a pair of configurable bus routing switches 0–1, 202, a pair of IO hub chips 0–1, 204 and a plurality of IO subsystems 0–4, 206 connected together with a plurality of busses 210, such as RIO busses. IO hub chips 0–1, 204 connect a system bus (not shown) with an IO bus, such as a RIO bus. Each of the IO hub chips 0–1, 204 includes four bus ports, such as four RIO bus ports. Each of the IO subsystems 0–4, 206 includes two bus ports, such as two RIO bus ports.

Configurable bus routing switches 0–1, 202 are multi-port switches implemented in a compileable design language. As shown in FIG. 2, configurable bus routing switches 0–1, 202 are 8-port configurable bus routing switches. At run time of the simulation model 200, the configurable bus routing switches 0–1, 202 are programmed to connect port 0 to any of the other 7 ports, port 1 to ports 2 through 7, port 2 to ports 3 through 7, and the like. By including one or more of the configurable bus routing switches 202, configuration requirements can be provided in one model, such as simulation model 200.

In FIGS. 3–7, the same reference characters as used in FIG. 2 are used to describe identical or similar components with respect to FIGS. 3–7.

FIG. 3 illustrates a logical view of the simulation model 200 with a second configuration of multiple IO subsystems and IO hub chips in accordance with the preferred embodiment generally designated by the reference character 300. In the simulation model configuration 300, by using the configurable bus routing switches 0–1, 202 as shown in FIG. 3, the IO hubs 0–1, 204 are connected in a pseudo-clustering loop with the IO subsystems 0–4, 206 connected to the IO hubs 0–1, 204.

FIG. 4 illustrates a logical view of a first simulation model 200 with a third configuration of multiple IO subsystems and IO hub chips in accordance with the preferred embodiment generally designated by the reference character 400. In the simulation model configuration 400, by using the configurable bus routing switches 0–1, 202 as shown in FIG. 4, a combination of loop connected IO subsystems 0–4, 206, point-to-point connected IO subsystems 0–4, 206 and string or chain connected IO subsystems 0–4, 206 are provided.

FIG. 5A illustrates a logical view of another simulation model with a selected configuration for connecting multiple IO subsystems and IO hub chips in accordance with the preferred embodiment generally designated by the reference character 500. As shown in FIG. 5, configurable bus routing switch 502 is a 32-port configurable bus routing switch. At run time of the simulation model 200, the configurable bus routing switch 502 is programmed to connect port 1 to any of the other 32 ports 2–32, port 2 to ports 3 through 32, port 3 to ports 4 through 32, and the like. In the simulation model configuration 500, a data striping mode is enabled together with a combination of clustering connections of IO hubs 0–3, 204 with and without included IO subsystems 0–10, 206, loop connected IO subsystems 0–10, 206, point-to-point connected IO subsystems 0–10, 206 and string or chain connected IO subsystems 0–10, 206.

FIG. 5A illustrates a logical view of simulation model 500 with a another selected configuration for connecting multiple IO subsystems and IO hub chips in accordance with the preferred embodiment generally designated by the reference character 510. Simulation model configuration 510 includes a point-to-point connected IO hub 0, 204 and IO subsystem 0, 206. Simulation model configuration 510 includes a string or chain connected IO hub 0, 204 and IO subsystems 1–2, 206 and a data striping connected IO hub 0, 204 and IO subsystem 3, 206. Loop connected IO hub 1, 204 and IO subsystems 4 and 5 are included in the simulation model configuration 510. A clustering loop connection of IO hubs 2–3, 204 is included in the simulation model configuration 510. A clustering loop with IO connection of IO hubs 2–3, 204 and IO subsystems 6–8, 206 also is included in the simulation model configuration 510.

Figure 6:
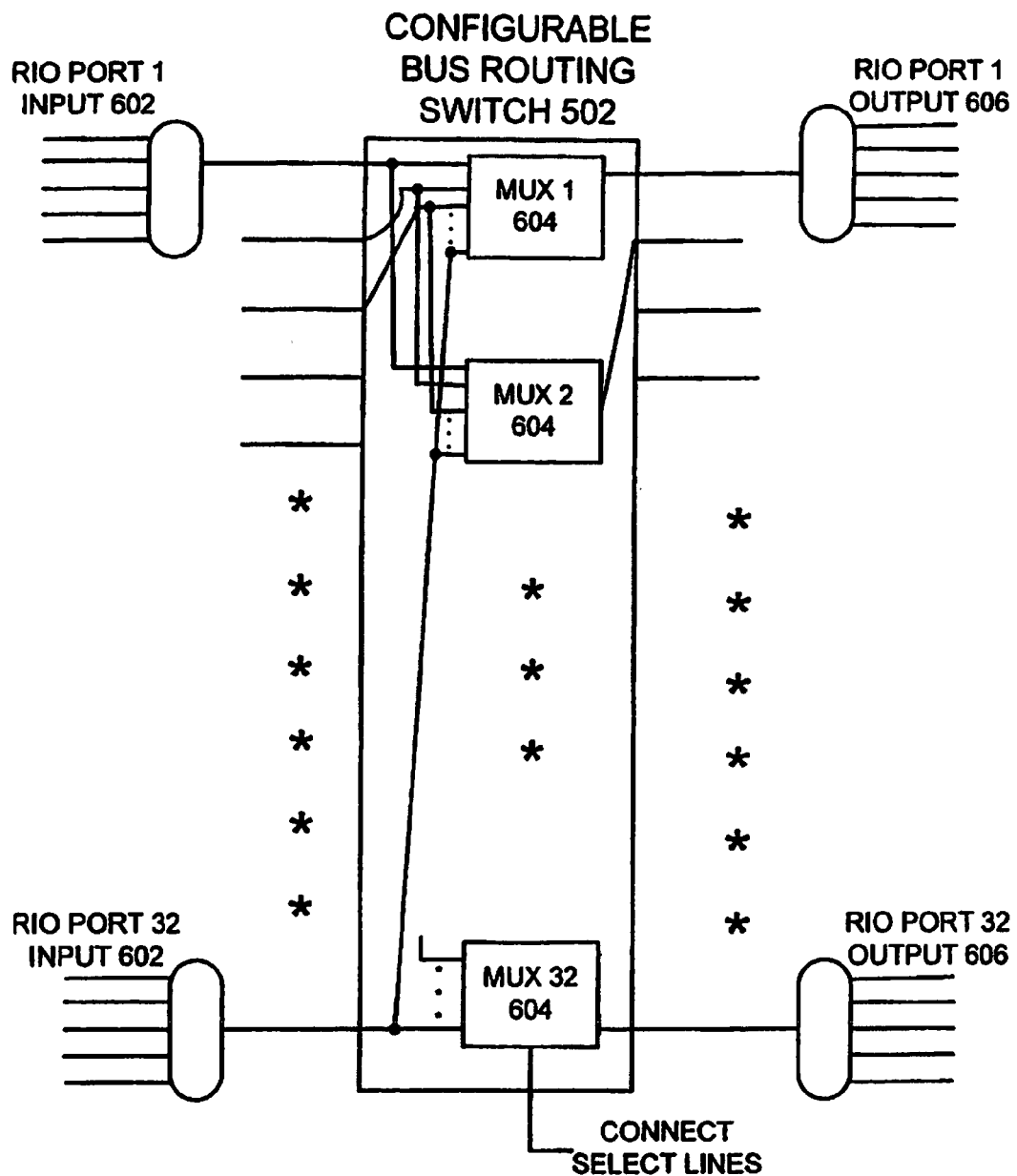
FIG. 6 is a block diagram representation illustrating a RIO switch of the simulation model of FIGS. 1 and 5 in accordance with the preferred embodiment.

FIG. 6 is a block diagram representation illustrating the configurable bus routing switch 502 in accordance with the preferred embodiment. As shown in FIG. 6, configurable bus routing switch 502 includes 32 RIO port inputs 1–32, 602 connected to 32 multiplexers 1–32, 604 respectively connected to 32 RIO port outputs 1–32, 606. A control input labeled CONNECT SELECT LINES is applied to the multiplexers 1–32, 604 for configuring the configurable bus routing switch 502.

Figure 7:
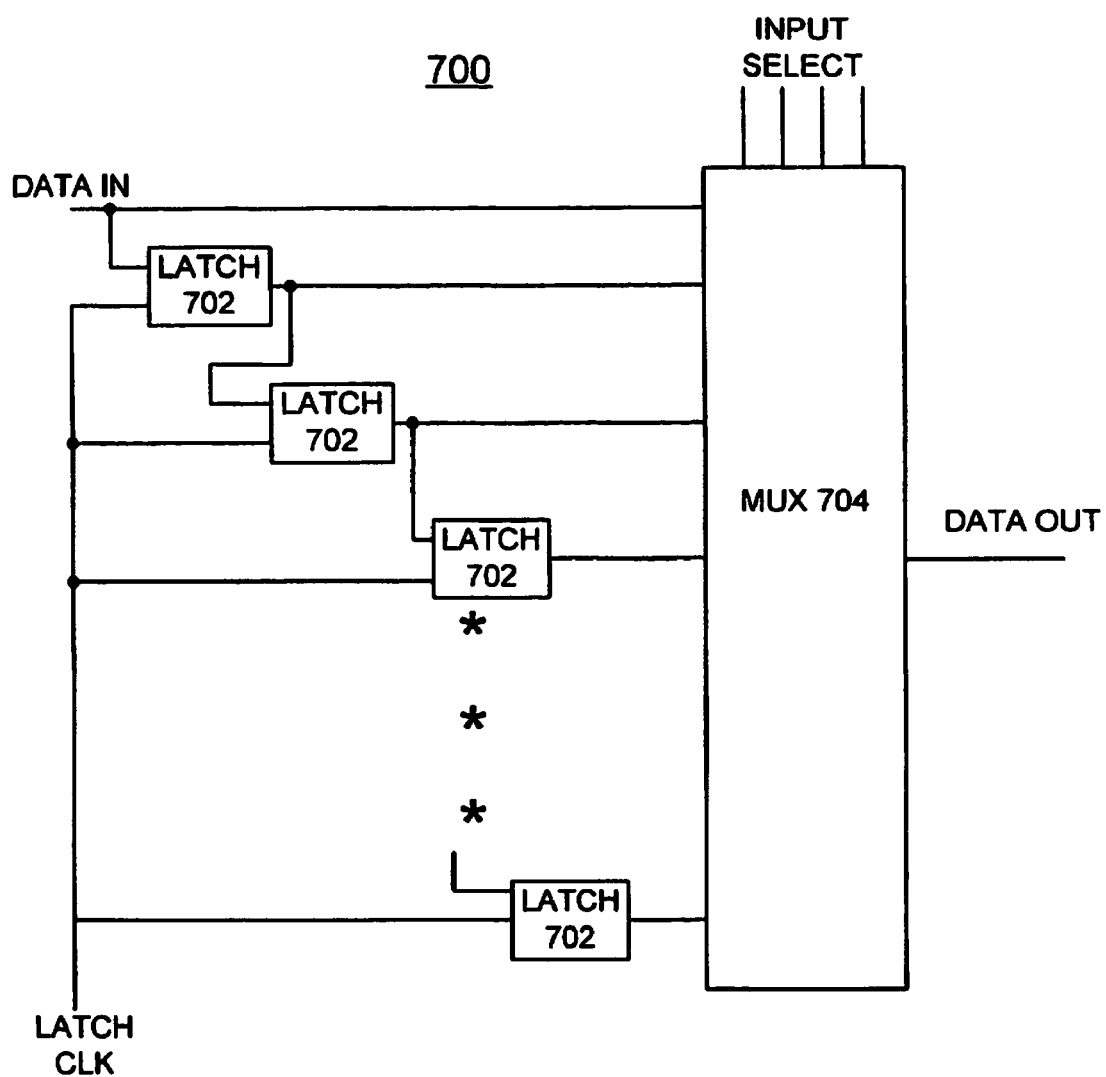
FIG. 7 is a diagram illustrating an exemplary variable delay latch structure in accordance with the preferred embodiment.

FIG. 7 is a diagram illustrating an exemplary variable depth latch structure in accordance with the preferred embodiment generally designated by the reference character 700. Configurable bus routing switch 202, 502 of the preferred embodiment advantageously is implemented with variable death latch structure 700 to simulate the effect of long wires. With the variable depth latch structure 700, each half of a RIO bus 210 can be delayed from 0 to N simulation cycles. The variable death latch structure 700 includes a plurality of latches 702 are connected in series between a DATA IN signal and to a respective input of a multiplexer 704 providing a DATA OUT signal of configurable bus routing switch 202, 502. A latch clock signal is applied to each of the plurality of latches 702. As used in the specification and claims, the term variable depth latch structure means the illustrated structure of FIG. 7.

Figure 8:
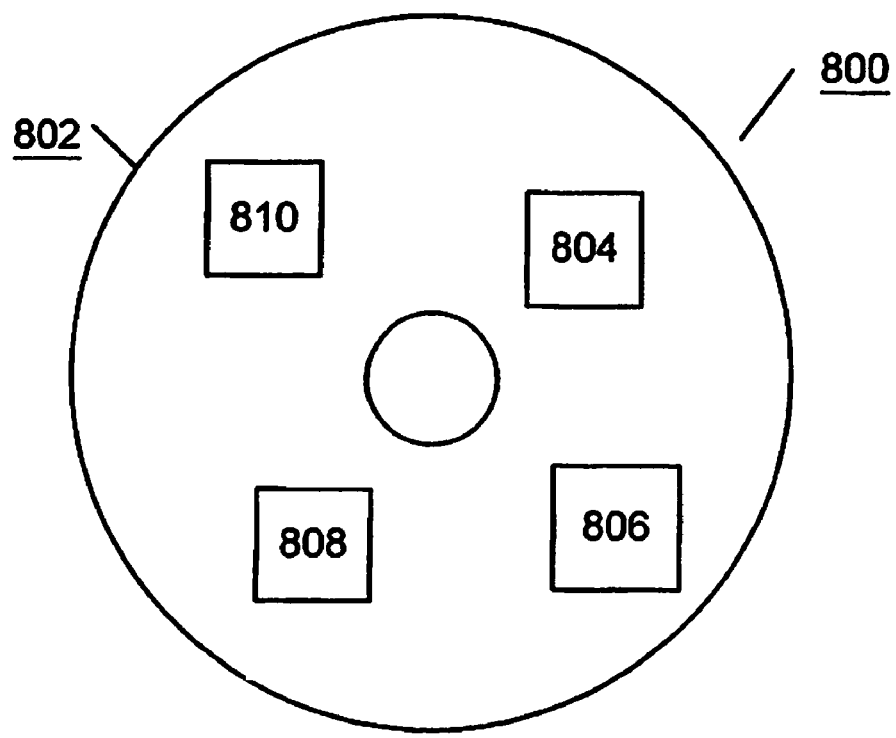
FIG. 8 is a block diagram illustrating a computer program product in accordance with the preferred embodiment.

Referring now to FIG. 8, an article of manufacture or a computer program product 800 of the invention is illustrated. The computer program product 800 includes a recording medium 802, such as, a floppy disk, a high capacity read only memory in the form of an optically read compact disk or CD-ROM, a tape, a transmission type media such as a digital or analog communications link, or a similar computer program product. Recording medium 802 stores program means 804, 806, 808, 810 on the medium 802 for carrying out the methods for implementing multiple configurations of multiple input/output (IO) subsystems in a single simulation model the preferred embodiment in the server system 100 of FIG. 1A.

A sequence of program instructions or a logical assembly of one or more interrelated modules defined by the recorded program means 804, 806, 808, 810, direct the server computer system 100 for implementing multiple configurations of multiple input/output (IO) subsystems in a single simulation model of the preferred embodiment.

While the present invention has been described with reference to the details of the embodiments of the invention shown in the drawing, these details are not intended to limit the scope of the invention as claimed in the appended claims.

What is claimed is:

1. Apparatus for implementing multiple configurations of multiple input/output (IO) subsystems in a single simulation model comprising:
    at least one simulation, configurable bus routing switch included in the single simulation model; said at least one bus routing switch including a plurality of ports respectively connected to a plurality of IO busses; said plurality of IO busses including remote input output (RIO) busses;
    predefined ones of said plurality of IO busses being connected to the multiple input/output (IO) subsystems in the single simulation model;
    said at least one bus routing switch being selectively configurable for interconnecting predetermined ones of said plurality of ports in the single simulation model; and
    said simulation, configurable bus routing switch including a variable depth latch structure to simulate the effect of long wires; said variable depth latch structure including a plurality of latches connected in series between a data input and a respective input of a multiplexer; a latch clock signal applied to each of said plurality of latches; and select inputs applied to said multiplexer for providing a multiplexer data output of one selected input.

2. Apparatus for implementing multiple configurations of multiple input/output (IO) subsystems in a single simulation model as recited in claim 1 wherein said variable depth structure includes said plurality of latches coupled in series between a IO bus input signal and a respective port input of said bus routing switch.

3. Apparatus for implementing multiple configurations of multiple input/output (IO) subsystems in a single simulation model as recited in claim 2 wherein said bus routing switch variable depth latch structure provides a selected delay of a predefined number of simulation cycles in the single simulation model.

4. Apparatus for implementing multiple configurations of multiple input/output (IO) subsystems in a single simulation model as recited in claim 1 includes at least one IO hub and selected ones of said IO busses connected between said at least one IO hub and said at least one simulation, configurable bus routing switch.

5. Apparatus for implementing multiple configurations of multiple input/output (IO) subsystems in a single simulation model as recited in claim 4 wherein said at least one simulation, configurable bus routing switch supports multiple connection types of the multiple input/output (IO) subsystems and the at least one IO hub including point to point, loop, and chain connected IO subsystems.

6. Apparatus for implementing multiple configurations of multiple input/output (IO) subsystems in a single simulation model as recited in claim 1 wherein said at least one simulation, configurable bus routing switch includes a plurality of multiplexers, each of said plurality of multiplexers including inputs connected to said plurality of ports and an output connected to a respective one of said plurality of ports.

7. Apparatus for implementing multiple configurations of multiple input/output (IO) subsystems in a single simulation model as recited in claim 6 wherein each of said plurality of multiplexers includes a control input for configuring said simulation, configurable bus routing switch.

8. A method for implementing multiple configurations of multiple input/output (IO) subsystems in a single simulation model comprising the steps of:
    implementing at least one simulation, configurable bus routing switch in the single simulation model; said at least one bus routing switch including a plurality of ports respectively connected to a plurality of IO busses; said plurality of IO busses including remote input output (RIO) busses;
    connecting the multiple input/output (IO) subsystems in the single simulation model to predefined ones of said plurality of IO busses;
    selectively configuring said at least one bus routing switch for interconnecting predetermined ones of said plurality of ports in the single simulation model; and
    implementing a variable depth latch structure in said at least one bus routing switch to simulate IO bus delay.

9. A method for implementing multiple configurations of multiple input/output (IO) subsystems in a single simulation model as recited in claim 8 includes the step of implementing said at least one simulation, configurable bus routing switch with a plurality of multiplexers, each of said plurality of multiplexers including inputs connected to said plurality of ports and an output connected to a respective one of said plurality of ports and having a control input for configuring said simulation, configurable bus routing switch.

10. A computer program product for implementing multiple configurations of multiple input/output (IO) subsystems in a single simulation model comprising:
    a recording medium;
    means, recorded on the recording medium, for implementing at least one simulation configurable bus routing switch in the single simulation model; said at least one bus routing switch including a plurality of ports respectively connected to a plurality of IO busses; said plurality of IO busses including remote input output (RIO) busses;

means, recorded on the recording medium, for connecting the multiple input/output (IO) subsystems in the single simulation model to predefined ones of said plurality of IO busses;

means, recorded on the recording medium, for selectively configuring said at least one bus routing switch for interconnecting predetermined ones of said plurality of ports in the single simulation model; and said means, recorded on the recording medium, for implementing at least one bus routing switch in the single simulation model including means, recorded on the recording medium, for implementing a variable depth latch structure in said at least one simulation, configurable bus routing switch to simulate IO bus delay.

11. A computer program product for implementing multiple configurations of multiple input/output (IO) subsystems in a single simulation model as recited in claim 10 wherein said means, recorded on the recording medium, for implementing at least one bus routing switch in the single simulation model includes means, recorded on the recording medium, for implementing said at least simulation, configurable one bus routing switch with a plurality of multiplexers, each of said plurality of multiplexers including inputs connected to said plurality of ports and an output connected to a respective one of said plurality of ports and having a control input for configuring said bus routing switch.

* * * * *